(12) United States Patent
Yamakoshi

(10) Patent No.: US 10,344,373 B2
(45) Date of Patent: Jul. 9, 2019

(54) PROCESS FOR PRODUCING A TARGET FORMED OF A SINTERING-RESISTANT MATERIAL OF A HIGH-MELTING POINT METAL ALLOY, SILICIDE, CARBIDE, NITRIDE OR BORIDE

(71) Applicant: JX NIPPON MINING & METALS CORPORATION, Tokyo (JP)

(72) Inventor: Yasuhiro Yamakoshi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 34 days.

(21) Appl. No.: 15/271,372

(22) Filed: Sep. 21, 2016

(65) Prior Publication Data

US 2017/0009335 A1    Jan. 12, 2017

Related U.S. Application Data

(62) Division of application No. 12/302,319, filed as application No. PCT/JP2008/051364 on Jan. 30, 2008, now Pat. No. 9,677,170.

(30) Foreign Application Priority Data

Feb. 9, 2007  (JP) ................................ 2007-030792

(51) Int. Cl.
    *B22F 3/24*     (2006.01)
    *C23C 14/34*    (2006.01)
    (Continued)

(52) U.S. Cl.
    CPC .......... *C23C 14/3414* (2013.01); *B22F 3/162* (2013.01); *B22F 3/24* (2013.01);
    (Continued)

(58) Field of Classification Search
    CPC ................ B22F 2007/045; B22F 7/04; C04B 2237/706; C04B 2237/708; C23C 14/3414; H01J 37/3426
    (Continued)

(56) References Cited

U.S. PATENT DOCUMENTS 4,731,116 A    3/1988  Kny
5,397,050 A    3/1995  Mueller
(Continued)

FOREIGN PATENT DOCUMENTS

JP    S63-169307 A    7/1988
JP    H05-025620 A    2/1993
(Continued)

*Primary Examiner* — Jie Yang
(74) *Attorney, Agent, or Firm* — Howson & Howson LLP

(57) ABSTRACT

A target is formed of a sintering-resistant material of high-melting point metal alloy, high-melting point metal silicide, high-melting point metal carbide, high-melting point metal nitride or high-melting point metal boride comprising a structure in which a material formed of a sintering-resistant material of high-melting point metal alloy, high-melting point metal silicide, high-melting point metal carbide, high-melting point metal nitride or high-melting point metal boride and a high-melting point metal plate other than the target are bonded. A production method of such a target is provided. Further the generation of cracks during the target production and high power sputtering, and the reaction of the target raw material with the die during hot pressing can be inhibited effectively, and the warpage of the target can be reduced.

7 Claims, 1 Drawing Sheet

(51) Int. Cl.
*C04B 37/02* (2006.01)
*C23C 14/06* (2006.01)
*B22F 3/16* (2006.01)
*B22F 7/04* (2006.01)
*C23C 14/14* (2006.01)
*H01J 37/34* (2006.01)

(52) U.S. Cl.
CPC .............. *B22F 7/04* (2013.01); *C04B 37/026* (2013.01); *C23C 14/067* (2013.01); *C23C 14/0635* (2013.01); *C23C 14/0641* (2013.01); *C23C 14/0682* (2013.01); *C23C 14/14* (2013.01); *H01J 37/3426* (2013.01); *B22F 2003/247* (2013.01); *B22F 2007/045* (2013.01); *B22F 2302/05* (2013.01); *B22F 2302/10* (2013.01); *B22F 2302/20* (2013.01); *B22F 2302/45* (2013.01); *B22F 2303/01* (2013.01); *B22F 2998/10* (2013.01); *C04B 2237/121* (2013.01); *C04B 2237/36* (2013.01); *C04B 2237/403* (2013.01); *C04B 2237/706* (2013.01); *C04B 2237/708* (2013.01)

(58) Field of Classification Search
USPC .......................................................... 148/422
See application file for complete search history.

(56) References Cited

U.S. PATENT DOCUMENTS

| | | |
|---|---|---|
| 5,693,203 A | 12/1997 | Ohhashi et al. |
| 5,863,398 A | 1/1999 | Kardokus et al. |
| 6,071,389 A | 6/2000 | Zhang |
| 6,376,281 B1 | 4/2002 | Kohler et al. |
| 6,759,143 B2 | 7/2004 | Oda et al. |
| 6,793,124 B1 | 9/2004 | Takahashi et al. |
| 6,858,116 B2 | 2/2005 | Okabe |
| 6,875,325 B2 | 4/2005 | Miyashita et al. |
| 7,347,353 B2 | 3/2008 | Yamakoshi |
| 7,459,036 B2 | 12/2008 | Okabe et al. |
| 7,651,658 B2 | 1/2010 | Aimone et al. |
| 7,998,287 B2 | 8/2011 | Wickersham, Jr. |
| 8,062,440 B2 | 11/2011 | Okabe et al. |
| 8,206,646 B2 | 6/2012 | Lo et al. |
| 8,241,438 B2 | 8/2012 | Okabe et al. |
| 8,262,816 B2 | 9/2012 | Okabe et al. |
| 2006/0189164 A1 | 8/2006 | Okabe et al. |
| 2007/0051624 A1 | 3/2007 | Okabe et al. |
| 2008/0116066 A1 | 5/2008 | Miyashita |

FOREIGN PATENT DOCUMENTS

| | | |
|---|---|---|
| JP | H05-086460 A | 4/1993 |
| JP | H06-009906 B2 | 2/1994 |
| JP | H11-350120 A | 12/1999 |
| JP | 2000-239838 A | 9/2000 |
| JP | 2001-295040 A | 10/2001 |

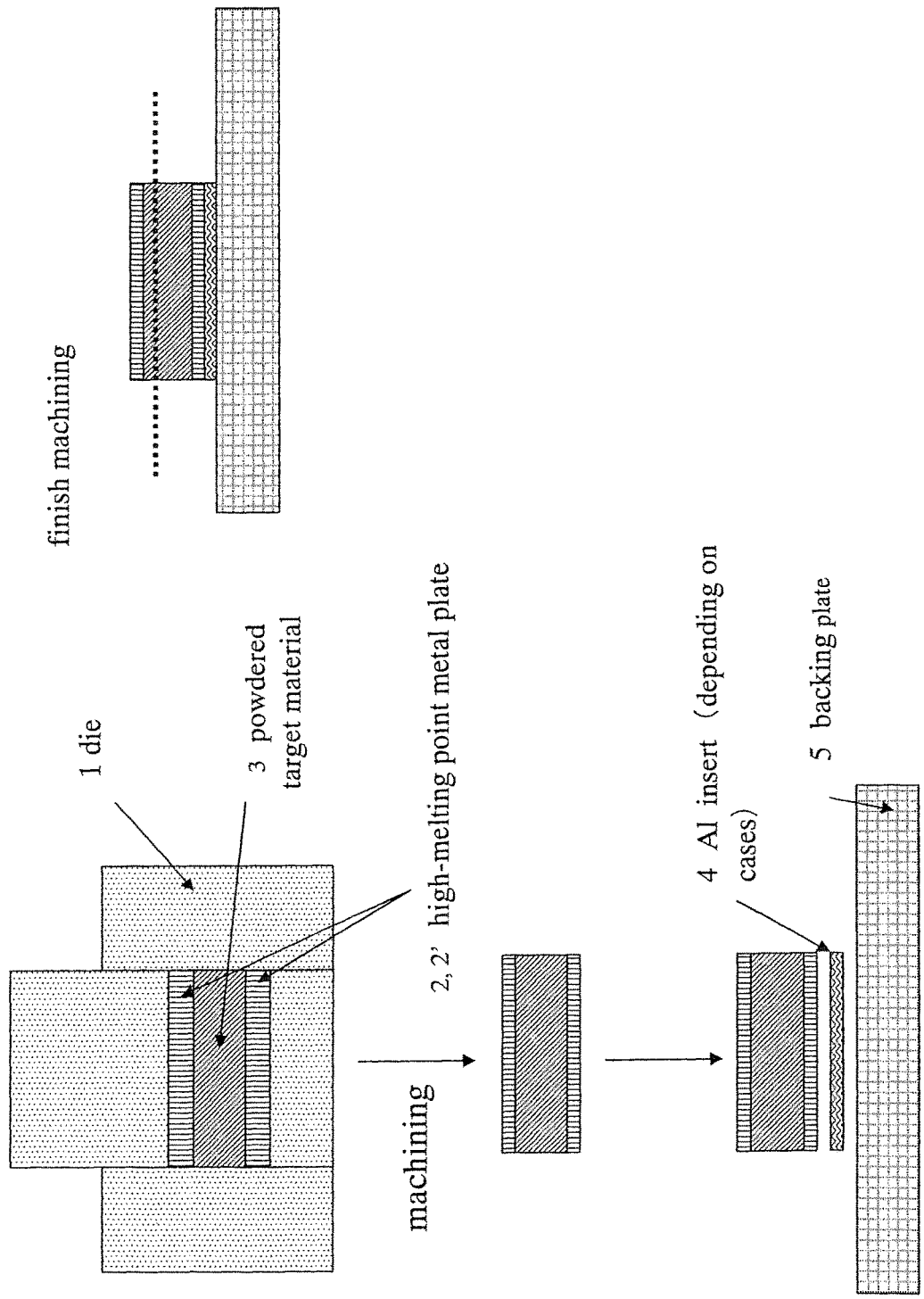

PROCESS FOR PRODUCING A TARGET FORMED OF A SINTERING-RESISTANT MATERIAL OF A HIGH-MELTING POINT METAL ALLOY, SILICIDE, CARBIDE, NITRIDE OR BORIDE

CROSS REFERENCE TO RELATED APPLICATIONS

This application is a divisional of U.S. application Ser. No. 12/302,319, now U.S. Pat. No. 9,677,170 B2, which is the National Stage of International Application No. PCT/JP2008/051364, filed Jan. 30, 2008, which claims the benefit under 35 USC 119 of Japanese Application No. 2007-030792, filed Feb. 9, 2007.

BACKGROUND

The present invention relates to a method of producing, with relative ease, a target formed of a sintering-resistant material of high-melting point metal alloy, high-melting point metal silicide, high-melting point metal carbide, high-melting point metal nitride or high-melting point metal boride, which has poor machinability. Specifically, the present invention relates to a target formed of a sintering-resistant material of high-melting point metal alloy, high-melting point metal silicide, high-melting point metal carbide, high-melting point metal nitride or high-melting point metal boride and its production method of inhibiting the generation of cracks during the target production and high power sputtering effectively. The present invention also relates to a sputtering target-backing plate assembly and its production method.

The term "high-melting point metal" as referred to herein is 4B, 5B, 6B, 7B, and 8 group metal of the Periodic Table of elements having a melting point of approximately 1700° C. or higher, and the term "high-melting point metal alloy" herein is an alloy or intermetallic compound formed of the foregoing high-melting point metal. The high-melting point metal silicide, high-melting point metal carbide, high-melting point metal nitride or high-melting point metal boride as referred to herein is the ceramic of the foregoing high-melting point metal having a melting point of approximately 1700° C. or higher.

The usage of a sintering-resistant material of high-melting point metal alloy, high-melting point metal silicide, high-melting point metal carbide, high-melting point metal nitride or high-melting point metal boride is rapidly expanding; for instance, as various barrier films in a solid state device, as various electrode materials of a semiconductor capacitor and the like, as various hard coating materials of cutting tools and the like.

For deposition based on the sputtering method, direct current (DC) sputtering, radio frequency (RF) sputtering or magnetron sputtering is used from the perspective of operability and stability of the film.

Formation of a film according to the sputtering method is performed by physically colliding accelerated positive ions such as Ar ions to a target placed on a cathode, emitting a material configuring the target based on the momentum exchange caused by the collision energy, and laminating a film having roughly the same composition as the target material on the substrate of the opposing anode.

The coating method based on the foregoing sputtering method is characterized in that it is able to form films in a wide range; for instance, thin films of Angstrom units to thick films of several tens of μm, with a stable deposition speed by adjusting the treatment time, power supply, and other conditions.

When depositing high-melting point metal alloy or high-melting point metal ceramic via sputtering, a requisite condition is to produce a sputtering target with powder metallurgy. However, there is a problem in that machining is difficult since the material is hard and brittle. When placing a target formed of high-melting point metal alloy or high-melting point metal ceramic on a sputtering device, it is necessary to bond such target to a backing plate, but there is an additional problem in that this processing of bonding is in itself difficult.

Although there are demands for performing ionization during the sputtering and performing such sputtering with high power, there is a problem in that, with a target that is solder-bonded using a brazing filler material or the like, the target will crack due to the melting or the like of the brazing filler material.

Conventionally, numerous types of sputtering target materials have been used, and some are easy to produce and others are difficult to produce like the present invention. Various schemes have been devised and reasonable production methods have been proposed, and some examples are described below.

For instance, Japanese Patent Laid-Open Publication No. H06-108246 A proposes technology of using an insert material having a lower melting point than the target material upon bonding a target having a melting point of 1000° C. or higher and a backing plate, and solid-phase diffusion bonding the insert material and the target, and the insert material and the backing plate, respectively. Although this production method is in itself extremely effective, it is necessary to prepare a plate-shaped target material in advance.

Even if this technology is applied to the production of a high-melting point metal alloy or high-melting point metal ceramic target and the target is prepared in a plate shape in advance, there is a problem in that the preparation for bonding the target with the backing plate cannot be made since it is not possible to perform crude processing to the bonding interface of the target. Accordingly, there is a problem in that this technology cannot be applied to the production of a high-melting point metal alloy or high-melting point metal ceramic target.

Japanese Patent Laid-Open Publication No. H05-025620 A discloses technology of arranging a brazing filler material and a buffer material between a target and a cooling member (backing plate), and forming a deposition or plated layer formed of a material for improving the wettability on the bonding interface of the target.

Nevertheless, with a target that is a high-melting point material and which is to be sputtered at high power, the bonding method using a brazing filler material having a low melting point cannot be adopted since it may cause an accident where such brazing filler material falls off during the sputtering.

Japanese Patent Laid-Open Publication No. S62-202732 A proposes technology of performing diffusion bonding or hard soldering via a metal insert material, which has thermal expansion that is smaller than a copper plate, between a graphite plate and the copper plate. This technology also entails the problems encountered in Japanese Patent Laid-Open Publication Nos. H06-108246 A and H05-025620 A described above, and cannot be applied to the production of a high-melting point metal alloy or high-melting point metal ceramic target.

Japanese Patent Laid-Open Publication No. S63-169307 A proposes technology of providing tungsten or its alloy powder on molybdenum or its alloy powder, additionally forming a coating layer of molybdenum powder thereon, subjecting this to hot forging, and ultimately cutting and eliminating the coating layer. This technology is for use as an X-ray tube target material and relates to a special production method, but since it does not in any solve the problem regarding the bonding of the target to the backing plate, it cannot be applied to the production of high-melting point metal alloy or high-melting point metal.

U.S. Pat. No. 5,397,050 proposes technology of placing a titanium backing plate and tungsten-titanium powder in a vacuumed can and simultaneously performing sintering and bonding based on HIP (Hot Isostatic Pressing) when manufacturing a sputtering target by bonding tungsten-titanium to a titanium backing plate. This technology is inefficient since the use of a vacuumed can is troublesome.

Moreover, although it is desirable to use a copper or copper alloy backing plate from the perspective of cooling efficiency, if the difference in the melting point between the target and the backing plate is significant as in this case, there is a problem in that the method cannot be applied since the bonding will be difficult.

U.S. Pat. No. 6,071,389 proposes forming a titanium intermediate layer between a target and a backing plate upon bonding a cobalt target plate and an aluminum or copper backing plate based on hot press or HIP. Nevertheless, in this case, it is a problem in that this is possible only when the target material itself has workability, and cannot be applied to the production of a high-melting point metal alloy or high-melting point metal ceramic target.

Japanese Patent Laid-Open Publication No. H05-086460 A describes improving the economic efficiency by diffusion bonding a nonmagnetic plate to a magnetic material target, and reducing the amount of magnetic material to be used, as well as providing mechanical strength to the magnetic material in order to prevent the generation of warpage and cracks during the machining process. This method aims to make the magnetic plate thinner, and, after preparing a magnetic plate in advance, a nonmagnetic plate to become the reinforcing plate is diffusion bonded thereto. This technology does not overcome the problem of bonding highly brittle sintering materials.

From a comprehensive standpoint, it is extremely difficult to product a target formed of high-melting point metal alloy or high-melting point metal ceramic with the conventional technology, and it was not possible to overcome the problem of target cracking during the production or sputtering.

SUMMARY

In light of the problematic points encountered by the conventional technology as described above, the present invention provides a method of producing, with relative ease, a target formed of a sintering-resistant material of high-melting point metal alloy, high-melting point metal silicide, high-melting point metal carbide, high-melting point metal nitride or high-melting point metal boride, which has poor machinability, as well as a high-melting point metal alloy or high-melting point metal ceramic sintered compact and its production method of effectively inhibiting the generation of cracks during the target production and high power sputtering, inhibiting the reaction of the target raw material with the die during hot pressing, and also reducing the warpage of the target.

In light of the above, the present invention provides a target formed of a sintering-resistant material of high-melting point metal alloy, high-melting point metal silicide, high-melting point metal carbide, high-melting point metal nitride or high-melting point metal boride comprising a structure in which a target material formed of a sintering-resistant material of high-melting point metal alloy, high-melting point metal silicide, high-melting point metal carbide, high-melting point metal nitride or high-melting point metal boride and a high-melting point metal plate other than the target material are bonded. The high-melting point metal plate may be a metal plate of tantalum, niobium, vanadium, titanium or molybdenum, or an alloy plate having the foregoing components as its main component. The thickness of the high-melting point metal plate may be 2 to 6 mm.

The present invention additionally provides a production method of a target formed of a sintering-resistant material of high-melting point metal alloy, high-melting point metal silicide, high-melting point metal carbide, high-melting point metal nitride or high-melting point metal boride, comprising the steps of placing a high-melting point metal plate other than a target material in a die, filling the die with powder formed of high-melting point metal alloy, high-melting point metal silicide, high-melting point metal carbide, high-melting point metal nitride or high-melting point metal boride, additionally inserting a high-melting point metal plate other than the target material on the filled powder to obtain a trilaminar structure, subsequently subjecting the trilaminar structure to pressing and diffusion bonding, and thereafter machining and eliminating the upper high-melting point metal plate to obtain the target. The high-melting point metal plate may be a metal plate of tantalum, niobium, vanadium, titanium or molybdenum, or an alloy plate respectively having the foregoing components as its main component. A graphite die may be used and the high-melting point metal plate may be subject to diffusion bonding at a temperature of 1000 to 2000° C. Sintering may be performed using a high-melting point metal plate of 2 to 6 mm thickness.

The present invention further provides a target-backing plate assembly formed of a sintering-resistant material of high-melting point metal alloy, high-melting point metal silicide, high-melting point metal carbide, high-melting point metal nitride or high-melting point metal boride, wherein a sintering-resistant compact target of high-melting point metal alloy, high-melting point metal silicide, high-melting point metal carbide, high-melting point metal nitride or high-melting point metal boride and a backing plate formed of copper or a copper alloy plate are bonded via a high-melting point metal plate other than the target material on the target side and an insert material formed of aluminum or an alloy having aluminum as its main component on the backing plate side. The insert material formed of aluminum or an alloy having aluminum as its main component may have a thickness of 1 to 4 mm.

The present invention also provides a production method of a target-backing plate assembly formed of a sintering-resistant material of high-melting point metal alloy, high-melting point metal silicide, high-melting point metal carbide, high-melting point metal nitride or high-melting point metal boride, comprising the steps of placing a high-melting point metal plate other than a target material in a die, filling the die with powder faulted of high-melting point metal alloy, high-melting point metal silicide, high-melting point metal carbide, high-melting point metal nitride or high-melting point metal boride, additionally inserting a high-melting point metal plate other than the target material on the filled powder to obtain a trilaminar structure, subjecting the trilaminar structure to pressing and diffusion bonding and thereafter removing it from the die, bonding the trilaminar structure to a backing plate formed of copper or a copper alloy plate via an insert material formed of aluminum or an alloy having aluminum as its main component, and, after the bonding, machining and eliminating the upper high-melting point metal plate. The bonding of the trilaminar structure to a backing plate formed of copper or a copper alloy plate via an insert material formed of aluminum or an alloy having aluminum as its main component may be performed at a low temperature of 150 to 350° C. The bonding may be performed using an insert material formed of aluminum or an alloy having aluminum as its main component and having a thickness of 1 to 4 mm.

The present invention yields a superior effect of being able to produce, with relative ease, a high-melting point metal alloy or high-melting point metal ceramic target. High power sputtering is enabled since it is possible to effectively inhibit the generation of cracks during the target production and sputtering. The present invention also yields significant effects of being able to inhibit the reaction of the target raw material with the die, reduce the warpage of the target during the target production, and perform ion sputtering in which the sputtered particles are ionized.

BRIEF DESCRIPTION OF DRAWINGS

The FIGURE is a schematic explanatory diagram of the production process of a target formed of a sintering-resistant material of high-melting point metal alloy, high-melting point metal silicide, high-melting point metal carbide, high-melting point metal nitride or high-melting point metal boride.

DETAILED DESCRIPTION

The present invention is now explained in detail with reference to the attached drawing.

A high-melting point metal plate 2 other than the target material (in the following explanation, the term "high-melting point metal plate" shall mean a high-melting point metal plate other than the target material) is placed in a die 1 shown in the FIGURE, and high-melting point metal ceramic powder 3 formed of high-melting point metal alloy or high-melting point metal silicide, high-melting point metal carbide, high-melting point metal nitride or high-melting point metal boride is filled therein. A graphite die is generally used as the die 1.

As long as it is a high-melting point alloy or an alloy containing high-melting point ceramics as its main component, it should be easily understood that the present invention can be applied to all high-melting point alloys or high-melting point ceramics containing other components as accessory components, and the present invention covers all of the above. Although cobalt, zirconium and the like may be listed as the accessory components, the selection of such accessory components is arbitrary, and the selection of accessory components other than those indicated above is free and unrestricted.

The primary object of the present invention is to produce, with relative ease, a high-melting point metal alloy or high-melting point metal ceramic target, which is difficult to machine, and to effectively inhibit the generation of cracks during the target production and high power sputtering. In other words, the present invention aims to overcome the weak points inherent to high-melting point metal alloy or high-melting point metal ceramics. The present invention can be applied to all such high-melting point metal alloys or high-melting point metal ceramics with the foregoing weak points. Accordingly, it should be easily understood that the present invention does not limit the selection of accessory components as described above.

In addition, although the foregoing high-melting point alloy has high-melting point metal as its main component, the term "main component" refers to a case where the high-melting point metal accounts for the largest amount among the metal components configuring the alloy. In many cases, although this refers to cases where the high-melting point metal is 50 wt % or greater, even if the high-melting point metal content is less than 50 wt % (for instance, a case where it is 40 wt %), the high-melting point alloy can be referred to as a main component if each of the other components configuring the alloy is less than 40 wt %. The present invention covers all such high-melting point alloys described above.

As described above, although the present invention adopts a bilaminar structure in which the high-melting point metal plate 2 other than the target material is placed in the die 1, and the high-melting point metal ceramic powder 3 formed of high-melting point metal alloy or high-melting point metal silicide, high-melting point metal carbide, high-melting point metal nitride or high-melting point metal boride is filled therein, it is desirable to adopt a trilaminar structure in which a high-melting point metal plate 2' is further inserted above the filled powder 3 so that the high-melting point metal alloy or high-melting point metal ceramic powder 3 is sandwiched therebetween. Although the following explanation refers to a trilaminar structure, the same applies to a bilaminar structure. The high-melting point metal plates 2, 2' assume important roles.

As described above, a significant feature of the present invention is to bond the high-melting point metal plates simultaneously with the sintering of the high-melting point metal ceramic powder. Incidentally, the high-melting point metal plates 2, 2' are not intended to function as a backing plate.

Since high-melting point metal alloy or high-melting point metal ceramics cannot be subject to standard machining, it is impossible to perform crude processing to the diffusion bonding interface. Therefore, as described later, by bonding the high-melting point metal plate 2, 2' simultaneously with sintering, the bonding interface of the high-melting point metal plates 2, 2' can be processed. The high-melting point metal plate 2 has a thickness of 2 to 6 mm. Although a preferable thickness is 2 to 6 mm, this thickness is arbitrary, and it is not necessary to limit the thickness to the foregoing range. The thickness may be suitably selected according to the size of the target.

Since the high-melting point metal plate 2 will come in contact with graphite at the time of sintering, its surface will carbonize. Thus, if the thickness is too thin (less than 2 mm), the overall thickness area will become carbonized, and the effect of diffusion bonding may not be sufficiently exhibited. Contrarily, if the high-melting point metal plate 2 is too thick, the cost of material will increase and there is a drawback in that the overall cost will increase. Accordingly, it is obvious that the thickness of the high-melting point metal plate 2 is preferably 2 to 6 mm. In particular, a thickness of 3 to 5 mm is recommended.

Further, the upper and lower high-melting point metal plates may also be arbitrarily selected so long as they are formed of a high-melting point material other than the target material. In other words, the upper and lower high-melting point metal plates may be formed of different types of materials, or may be formed of the same type of material. The selection of the material is arbitrary and there is no particular limitation.

After filling the high-melting point metal plates 2, 2' and the high-melting point metal alloy or high-melting point metal ceramics in the die 1, this is pressed to sinter the high-melting point metal alloy or high-melting point metal ceramic powder 3, and simultaneously diffusion bonded with the high-melting point metal plates 2, 2'.

A desirable diffusion bonding temperature is in the range of 1000 to 1800° C. By using the high-melting point metal plates 2, 2', it is possible to prevent many of the reactions between the high-melting point metal alloy or high-melting point metal ceramics and the die. In addition, compressive residual stress can be applied to the high-melting point metal plates 2, 2' to inhibit the generation of cracks in the target and reduce the warpage of the target effectively.

As the material of the high-melting point metal plates 2, 2', used may be tantalum, niobium, vanadium, titanium or molybdenum, or an alloy having each of the foregoing components as its main component. In particular, it is effective to use a tantalum plate or an alloy plate having tantalum as its main component.

Since titanium or an alloy having titanium as its main component has weak bond strength with the sintered high-melting point metal alloy or high-melting point metal ceramics, it could be said that it is not as favorable as the other foregoing materials for use in the high-melting point metal plates 2, 2'. Nevertheless, the present invention does deny the use of such titanium or an alloy having titanium as its main component. However, the other materials for use in the high-melting point metal plates 2, 2' are all effective.

The reason why tantalum, niobium, vanadium, titanium or molybdenum, or an alloy having each of the foregoing components as its main component is suitable as the material of the high-melting point metal plate is because the plastic workability and machining at room temperature is superior, and, since the crystal structure is BCC at a high temperature and trace amounts of gas components such as oxygen will interstitially become a solid solution, a thick oxide film will not be formed at the bonding interface.

Consequently, it is possible to sinter the alloy or high-melting point metal ceramics having as its main component the high-melting point metal sandwiched between the high-melting point metal plates 2, 2', and diffusion bond the layers to obtain a sintered compact. With high power sputtering, the diffusion bonding of the target and the high-melting point metal plates 2, 2' is essential. It is possible to machine and eliminate the upper high-melting point metal plate 2' to obtain a target. In the case of a bilaminar structure, this machining and elimination process are not required.

Moreover, as shown in the FIGURE, the alloy or high-melting point metal ceramic sintered compact having as its main component the high-melting point metal of the trilaminar structure which was diffusion bonded and sandwiched between the high-melting point metal plates 2, 2' can be bonded to a backing plate 5 formed of copper or a copper alloy plate via an insert material 4 formed of aluminum or an alloy having aluminum as its main component.

The objective of using the insert material 4 formed of aluminum or an alloy having aluminum as its main component is to enable bonding at a low temperature, and, as a result, effectively inhibit the warpage of the target after bonding. As the material of the backing plate 5 formed of a copper alloy plate, considered may be copper-zinc alloy (brass), copper-nickel-chromium-silicon alloy (collision alloy), phosphor bronze, and so on, but it goes without saying that other copper alloys may also be used.

The bonding to be perform-red using the insert material 4 is desirably conducted at a low temperature of 150 to 350° C. This bond temperature will suffice since there is an insert material 4 formed of aluminum or an alloy having aluminum as its main component. Bonding at a high temperature is not preferable since it will cause strain on the target and the backing plate.

The foregoing bond temperature merely shows the optimal temperature range, and it should be understood that the temperature does not have to be limited to the foregoing range. The bond temperature may be arbitrarily selected according to the size and material of the target, and size and material of the backing plate.

The thickness of the insert material to be used formed of aluminum or an alloy having aluminum as its main component is preferably 1 to 4 mm. Effective bonding is thereby enabled.

Although the bonding interface of the high-melting point metal and the backing plate is subject to machining and crude processing for bonding, if the insert material is too thin, the deformability of the roughened face will be insufficient, and the function as an insert material will be lost. Moreover, if the insert material is too thick, since aluminum with weak strength will be used as a part of the backing plate, the overall strength will deteriorate, and there is a problem in that warpage or deformation will occur during the sputtering. In light of the above, the thickness of the insert material formed of aluminum or an alloy having aluminum as its main component is preferably 1 to 4 mm, and more preferably 1.5 to 2.5 mm.

With the target bonded to the backing plate, the high-melting point metal plate 2' existing on the surface can be cut and eliminated (a part of the high-melting point metal alloy or high-melting point metal ceramics on the surface is also eliminated) to obtain a target assembly with the high-melting point metal alloy or high-melting point metal ceramics being exposed.

As a result of using the foregoing sintered compact sputtering target, a high-melting point metal alloy or high-melting point metal ceramic film can be formed on the substrate via DC sputtering, RF sputtering, magnetron sputtering or the like. Incidentally, sputtering with directivity that enables ionization during such sputtering can also be performed.

Generally the high-melting point metal alloy or high-melting point metal ceramic film can be easily deposited with DC sputtering. Accordingly, it would be preferable to perform deposition using a DC sputtering device that is simple, highly reliable, and most stable. The representative examples of the DC sputtering conditions are shown below. These sputtering conditions may also be arbitrarily changed.

Sputter gas: Ar 90 to 100%, 0 to 10% $O_2$
Sputter gas pressure: 0.1 to 5 Pa
Input power: 10 to 30 kw
Deposition speed: Approximately 100 to 300 Å/min
Substrate temperature: Room temperature to 300° C.
Distance between substrates: 50 to 300 mm

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1-1 to Example 1-30

As the high-melting point metal, plates formed of tantalum, niobium, vanadium, titanium or molybdenum respectively having a thickness of 1 mmt, 2 mmt, 4 mmt, 6 mmt, 8 mmt, and 10 mmt were used, the high-melting point metal plate was placed in a graphite die, and, as the high-melting point metal alloy to become the raw material of the target, tungsten carbide powder, tantalum carbide powder, zirconium boride powder, tantalum silicide powder, tungsten silicide powder, titanium nitride powder, and tantalum nitride powder were respectively filled on the high-melting point metal plate. These combinations are shown in Table 1.

The same high-melting point metal plate as; the one described above was additionally placed on the filled high-melting point metal alloy or high-melting point metal ceramics, this was sintered via hot pressing in a vacuum at a pressure of 100 kg/cm$^2$ and temperature of 1850° C. (1600° C. if a titanium plate was used as the high-melting point metal) for 10 hours, and the upper and lower high-melting point metal plates were bonded simultaneously with the sintering of the high-melting point metal alloy or high-melting point metal ceramics. Subsequently, this was removed from the graphite die, and a high-melting point metal alloy or high-melting point metal ceramic sintered compact (target material) of a trilaminar structure bonded with the upper and lower high-melting point metal plates was obtained.

The end of the sintered compact was sampled with electrical discharging to measure the shear strength of the bonding interface. The results are similarly shown in Table 1. The shear strength was in the range of 3.1 to 11.3 kg/mm$^2$, and it was possible to obtain a high-strength sintered compact bonded with the high-melting point metal plates.

However, the bond strength of titanium or an alloy having titanium as its main component was too weak and could not be bonded with the sintered high-melting point metal alloy or high-melting point metal ceramics.

Nevertheless, since this was effective for at target raw material formed of tantalum silicide and tungsten silicide, titanium or an alloy having titanium as its main component can also be used as the high-melting point plate. Incidentally, with thin high-melting point metal having a thickness of roughly 1 mmt, the shear strength tended to deteriorate. This is considered to be because of the influence of carburizing from the graphite die. Accordingly, it is evident that, preferably, the high-melting point metal plate is sufficiently thick. A particularly preferable range of thickness of the high-melting point metal plate is 2 to 6 mm. However, it should be understood that the high-melting point metal plate with a thickness of roughly 1 mmt can also be used.

TABLE 1

Shear strength of target material and high-melting point metal plate

| Examples | High-Melting Point Metal Plate | Target Material | | | | | | | | |
|---|---|---|---|---|---|---|---|---|---|---|
| | | W—Re | Nb—Os | WC | TaC | ZrB$_2$ | TaSi$_2$ | WSi$_2$ | TiN | TaN |
| 1-1 | Ta 1 mmt | 7.3 | 8.1 | 5.1 | 3.8 | 5.1 | 3.3 | 4.5 | 3.1 | 3.1 |
| 1-2 | Ta 2 mmt | 10.3 | 9.9 | 7.4 | 6.9 | 6.6 | 5.1 | 4.6 | 3.9 | 3.7 |
| 1-3 | Ta 4 mmt | 9.8 | 11 | 7.3 | 7.1 | 6.5 | 4.9 | 4.8 | 3.3 | 3.7 |
| 1-4 | Ta 6 mmt | 10.1 | 11.3 | 7.6 | 7.8 | 6.8 | 4.9 | 4.9 | 3.6 | 3.6 |
| 1-5 | Ta 8 mmt | 9.9 | 10.9 | 6.8 | 7.6 | 6.8 | 5.1 | 4.7 | 3.5 | 3.6 |
| 1-6 | Ta 10 mmt | 10 | 9.8 | 7.1 | 7.5 | 6.8 | 4.8 | 4.6 | 3.5 | 3.6 |
| 1-7 | Nb 1 mmt | 6.5 | 3.1 | 3.3 | 5.1 | 5.7 | 4.1 | 4.3 | 4.2 | 3.5 |
| 1-8 | Nb 2 mmt | 8.1 | 7.9 | 7.4 | 7.3 | 6.9 | 5 | 5.1 | 4.9 | 5.5 |
| 1-9 | Nb 4 mmt | 6.9 | 8.1 | 7.3 | 7.5 | 6.5 | 4.3 | 5.4 | 4.8 | 5.3 |
| 1-10 | Nb 6 mmt | 8.7 | 7.6 | 6.9 | 7.1 | 6.7 | 4.9 | 5.3 | 4.8 | 5.2 |
| 1-11 | Nb 8 mmt | 7.3 | 7.5 | 6.9 | 7.3 | 6.8 | 4.9 | 5.6 | 4.7 | 5.1 |
| 1-12 | Nb 10 mmt | 7.6 | 7.6 | 6.9 | 7.2 | 6.6 | 5.2 | 5.6 | 4.6 | 5.6 |
| 1-13 | V 1 mmt | 4.9 | 3.6 | 4.8 | 5.9 | 3.8 | 3.1 | 3.6 | 3.1 | 3.4 |
| 1-14 | V 2 mmt | 7.9 | 7.5 | 5.4 | 6.5 | 6.2 | 4.3 | 4.6 | 4.6 | 5.2 |
| 1-15 | V 4 mmt | 7 | 6.2 | 5.6 | 6.2 | 6.4 | 4.1 | 4.6 | 4.5 | 4.9 |
| 1-16 | V 6 mmt | 8.5 | 6.9 | 5.0 | 6.3 | 6.1 | 3.9 | 4.5 | 4.5 | 4.9 |
| 1-17 | V 8 mmt | 8.7 | 6.8 | 4.9 | 6.2 | 6 | 3.8 | 4.4 | 5.1 | 4.8 |
| 1-18 | V 10 mmt | 8.5 | 6.2 | 4.8 | 6.3 | 5.9 | 3.4 | 4.4 | 5.3 | 4.8 |
| 1-19 | Ti 1 mmt | — | — | — | — | — | 4.5 | 3.1 | — | — |
| 1-20 | Ti 2 mmt | — | — | — | — | — | 4.8 | 3.5 | — | — |
| 1-21 | Ti 4 mmt | — | — | — | — | — | 5 | 3.3 | — | — |
| 1-22 | Ti 6 mmt | — | — | — | — | — | 4.1 | 3.1 | — | — |
| 1-23 | Ti 8 mmt | — | — | — | — | — | 5.2 | 3.5 | — | — |
| 1-24 | Ti 10 mmt | — | — | — | — | — | 5.3 | 3.8 | — | — |
| 1-25 | Mo 1 mmt | 5.7 | 6.3 | 5.4 | 3.3 | 3.9 | 3.4 | 3.8 | 5.2 | 4.4 |
| 1-26 | Mo 2 mmt | 6.5 | 6.3 | 6.3 | 5.9 | 5.7 | 5.3 | 5.7 | 5.3 | 5.8 |
| 1-27 | Mo 4 mmt | 5.5 | 7.2 | 6.7 | 5.4 | 5.5 | 5.1 | 5.6 | 5.9 | 5.7 |
| 1-28 | Mo 6 mmt | 6.2 | 7.6 | 6.2 | 5.3 | 4.9 | 5.1 | 5.5 | 5.4 | 5.3 |
| 1-29 | Mo 8 mmt | 5.6 | 7.6 | 6.5 | 5.3 | 4.9 | 5.3 | 5.3 | 5.7 | 5.4 |
| 1-30 | Mo 10 mmt | 5.7 | 7.7 | 5.4 | 5.1 | 4.7 | 4.9 | 5.4 | 5.6 | 5.3 |

—: unable to bond

Example 2-1 to Example 2-27

In accordance with Example 1 above, as the high-melting point metal, tantalum plates respectively having a thickness 2 mmt, 4 mmt, and 6 mmt, a niobium plate having a thickness of 2 mmt, a vanadium plate having a thickness of 2 mmt, a titanium plate having a thickness of 2 mmt, and a molybdenum plate having a thickness of 2 mmt were used, the high-melting point metal plate was placed in a graphite die, and niobium-osmium alloy powder to become the target material was filled on the high-melting point metal plate. However, with Example 2-6, Example 2-15 and Example 2-24 that used a titanium plate as the high-melting point plate, tantalum silicide powder was filled as the target material.

The same high-melting point metal plate as the one described above was additionally placed on the filled niobium-osmium alloy powder, this was sintered via hot pressing in a vacuum at a pressure of 100 kg/cm² and temperature of 1850° C. for 10 hours, and the upper and lower high-melting point metal plates were bonded simultaneously with the sintering of the niobium-osmium alloy powder. However, with Example 2-6, Example 2-15 and Example 2-24 that used a titanium plate as the high-melting point plate, sintering was performed at a hot press temperature of 1600° C.

Subsequently, this was removed from the graphite die, and a niobium-osmium alloy sintered compact (target material) of a trilaminar structure bonded with the upper and lower high-melting point metal plates was obtained, and, with regard to Example 2-6, Example 2-15 and Example 2-24, a tantalum silicide sintered compact (target material) of a trilaminar structure bonded with the upper and lower high-melting point metal plates was obtained.

Subsequently, the surface of this high-melting point metal plate was subject to machining and narrowly cut to obtain a smooth surface, the target material bonded with the foregoing melting point metal plates was mounted on a backing plate via aluminum and aluminum alloy insert materials of 1 mm and 4 mm, and these were heated to 150° C. and bonded. In this case, used as the backing plate were pure copper, copper-1% chromium alloy, and copper-40% zinc alloy.

What is important in these Examples is that the bonding was performed via an aluminum insert material. Here, the issue is whether sufficient bond strength with the backing plate can be obtained. Therefore, tensile testing of the bonding interface of the representative high-melting point metal plates described above and the niobium-osmium alloy compound plate bonded via an aluminum or aluminum alloy insert was conducted. The results are shown in Table 2.

As shown in Table 2, in all cases the result was 10.2 to 15.0 kgf/mm², and there was sufficient bond strength between the target material and the backing plate material. The advantage of bonding the target via an aluminum or aluminum alloy insert material is that bonding can be performed at a low temperature. Consequently, a significant effect is yielded in that the amount of warpage of the target will be small.

The amount of warpage of the bond is shown in Table 3. As shown in Table 3, the amount of warpage of the target was minimal at 0.1 mm (only one target shown in Table 3 was 0.2 mm), and was not at a problematic level in producing the target.

Subsequently, the upper high-melting point metal plate was cut and eliminated to expose the niobium-osmium alloy face (tantalum silicide face in the case of Example 2-6, Example 2-15 and Example 2-24), the backing plate was machined into a prescribed shape, and the target was bonded to the backing plate via the high-melting point metal plate and an aluminum insert or aluminum alloy material so as to obtain niobium-osmium alloy and a tantalum silicide sintered compact sputtering target.

The sputtering target material prepared as described above was DC sputtered onto a SiO$_2$ substrate under the following conditions. Consequently, there was no generation of cracks in the target material and stable sputtering was possible up to the target life end.

Sputtering Conditions

Sputter gas: Ar (100%)

Sputter gas pressure: 0.6 Pa

Input power: 25 kw

Distance between substrates: 100 mm

TABLE 2

Tensile testing of high-melting point metal plate-Al, Al alloy insert-backing plate (Unit: kgf/mm²)

| | | | Thickness of insert materials | |
|---|---|---|---|---|
| Examples | High-melting point metal plate | Insert materials | 1 mm | 4 mm |

Pure copper backing plate (bonded at 150° C.)

| Examples | High-melting point metal plate | Insert materials | 1 mm | 4 mm |
|---|---|---|---|---|
| 2-1 | Ta 2 mmt | Al | 13.5 | 13.2 |
| 2-2 | Ta 4 mmt | Al | 13.3 | 13.5 |
| 2-3 | Ta 6 mmt | Al | 13.1 | 12.9 |
| 2-4 | Nb 2 mmt | Al | 12.2 | 12.3 |
| 2-5 | V 2 mmt | Al | 12.4 | 12.1 |
| 2-6 | Ti 2 mmt | Al | 13.1 | 13.0 |
| 2-7 | Mo 2 mmt | Al | 12.9 | 12.8 |
| 2-8 | Ta 2 mmt | Al alloy (5052) | 10.3 | 10.5 |
| 2-9 | Ta 4 mmt | Al alloy (5052) | 11.0 | 10.6 |

Copper-chromium alloy backing plate (bonded at 150° C.)

| Examples | High-melting point metal plate | Insert materials | 1 mm | 4 mm |
|---|---|---|---|---|
| 2-10 | Ta 2 mmt | Al | 14.1 | 14 |
| 2-11 | Ta 4 mmt | Al | 14.2 | 14 |
| 2-12 | Ta 6 mmt | Al | 13.8 | 13.8 |
| 2-13 | Nb 2 mmt | Al | 12.8 | 13.3 |
| 2-14 | V 2 mmt | Al | 11.3 | 11.5 |
| 2-15 | Ti 2 mmt | Al | 14.3 | 15.0 |
| 2-16 | Mo 2 mmt | Al | 14.2 | 14.9 |
| 2-17 | Ta 2 mmt | Al alloy (5052) | 11.3 | 11.6 |
| 2-18 | Ta 4 mmt | Al alloy (5052) | 11.7 | 11.2 |

Copper-zinc backing plate (bonded at 150° C.)

| Examples | High-melting point metal plate | Insert materials | 1 mm | 4 mm |
|---|---|---|---|---|
| 2-19 | Ta 2 mmt | Al | 14 | 14.3 |
| 2-20 | Ta 4 mmt | Al | 13.9 | 14.2 |
| 2-21 | Ta 6 mmt | Al | 13.8 | 14 |
| 2-22 | Nb 2 mmt | Al | 13.2 | 13.3 |
| 2-23 | V 2 mmt | Al | 14.1 | 13.8 |
| 2-24 | Ti 2 mmt | Al | 13.5 | 13.6 |
| 2-25 | Mo 2 mmt | Al | 11.2 | 11.1 |
| 2-26 | Ta 2 mmt | Al alloy (5052) | 10.2 | 10.4 |
| 2-27 | Ta 4 mmt | Al alloy (5052) | 10.7 | 10.7 |

TABLE 3

Amount of warpage of bonds
(Unit: mm)

Pure copper backing plate (bonded at 150° C.)

| Examples | High-melting point metal plate | Insert materials | Thickness of insert materials 1 mm | 4 mm |
|---|---|---|---|---|
| 2-1 | Ta 2 mmt | Al | 0.1 | 0.1 |
| 2-2 | Ta 4 mmt | Al | 0.1 | 0.1 |
| 2-3 | Ta 6 mmt | Al | 0.1 | 0.1 |
| 2-4 | Nb 2 mmt | Al | 0.1 | 0.1 |
| 2-5 | V 2 mmt | Al | 0.1 | 0.1 |
| 2-6 | Ti 2 mmt | Al | 0.2 | 0.1 |
| 2-7 | Mo 2 mmt | Al | 0.1 | 0.1 |
| 2-8 | Ta 2 mmt | Al alloy (5052) | 0.1 | 0.1 |
| 2-9 | Ta 4 mmt | Al alloy (5052) | 0.1 | 0.1 |

Copper-chromium alloy backing plate (bonded at 150° C.)

| Examples | High-melting point metal plate | Insert materials | Thickness of insert materials 1 mm | 4 mm |
|---|---|---|---|---|
| 2-10 | Ta 2 mmt | Al | 0.1 | 0.1 |
| 2-11 | Ta 4 mmt | Al | 0.1 | 0.1 |
| 2-12 | Ta 6 mmt | Al | 0.1 | 0.1 |
| 2-13 | Nb 2 mmt | Al | 0.1 | 0.1 |
| 2-14 | V 2 mmt | Al | 0.1 | 0.1 |
| 2-15 | Ti 2 mmt | Al | 0.1 | 0.1 |
| 2-16 | Mo 2 mmt | Al | 0.1 | 0.1 |
| 2-17 | Ta 2 mmt | Al alloy (5052) | 0.1 | 0.1 |
| 2-18 | Ta 4 mmt | Al alloy (5052) | 0.1 | 0.1 |

Copper-zinc backing plate (bonded at 150° C.)

| Examples | High-melting point metal plate | Insert materials | Thickness of insert materials 1 mm | 4 mm |
|---|---|---|---|---|
| 2-19 | Ta 2 mmt | Al | 0.1 | 0.1 |
| 2-20 | Ta 4 mmt | Al | 0.1 | 0.1 |
| 2-21 | Ta 6 mmt | Al | 0.1 | 0.1 |
| 2-22 | Nb 2 mmt | Al | 0.1 | 0.1 |
| 2-23 | V 2 mmt | Al | 0.1 | 0.1 |
| 2-24 | Ti 2 mmt | Al | 0.1 | 0.1 |
| 2-25 | Mo 2 mmt | Al | 0.1 | 0.1 |
| 2-26 | Ta 2 mmt | Al alloy (5052) | 0.1 | 0.1 |
| 2-27 | Ta 4 mmt | Al alloy (5052) | 0.1 | 0.1 |

Example 3-1 to Example 3-27

In these Examples, as with Example 2 described above, high-melting point metal and niobium-osmium alloy powder were used (provided that tantalum silicide powder was used in Example 3-6, Example 3-15 and Example 3-24) to obtain target materials formed of a niobium-osmium alloy sintered compact and a tantalum silicide sintered compact of a trilaminar structure bonded with the upper and lower high-melting point metal plates. Subsequently, as with Example 2, the target material bonded with the foregoing melting point metal plates was mounted on a backing plate via aluminum and aluminum alloy insert materials of 1 mm and 4 mm.

The difference with Example 2 and this case is that these were heated to 250° C. and bonded. Similarly, tensile testing of the bonding interface of the niobium-osmium alloy compound plate and the tantalum silicide compound plate was conducted. The results are shown in Table 4. As shown in Table 4, the bond strength in all cases was 13.5 to 16.4 kgf/mm², and there was sufficient bond strength between the target material and the backing plate material. This bond strength generally improved in comparison to the bond strength of Example 2.

Meanwhile, the amount of warpage of the bond is shown in Table 5. As shown in Table 5, the amount of warpage was slightly higher in comparison to Example 2. Nevertheless, the amount of warpage in all cases was slight at 0.2 mm, and was not at a problematic level in producing the target.

Subsequently, the upper high-melting point metal plate was cut and eliminated to expose the niobium-osmium alloy face (tantalum silicide face in the case of Example 3-6, Example 3-15 and Example 3-24), the backing plate was machined into a prescribed shape, and the target was bonded to the backing plate via the high-melting point metal plate and an aluminum insert or aluminum alloy material so as to obtain a niobium-osmium alloy sintered compact sputtering target and a tantalum silicide sintered compact sputtering target.

The sputtering target material prepared as described above was DC sputtered onto a $SiO_2$ substrate under the same conditions as the foregoing conditions. Consequently, there was no generation of cracks in the target material and stable sputtering was possible up to the target life end.

TABLE 4

Tensile testing of high-melting point metal plate-Al,
Al alloy insert-backing plate (Unit: kgf/mm²)

Pure Cu backing plate (bonded at 250° C.)

| Examples | High-melting point metal plate | Insert materials | Thickness of insert materials 1 mm | 4 mm |
|---|---|---|---|---|
| 3-1 | Ta 2 mmt | Al | 15.3 | 15.4 |
| 3-2 | Ta 4 mmt | Al | 14.8 | 15.2 |
| 3-3 | Ta 6 mmt | Al | 14.7 | 14.3 |
| 3-4 | Nb 2 mmt | Al | 15.4 | 15.5 |
| 3-5 | V 2 mmt | Al | 15.8 | 15.4 |
| 3-6 | Ti 2 mmt | Al | 16 | 15.7 |
| 3-7 | Mo 2 mmt | Al | 16.2 | 15.6 |
| 3-8 | Ta 2 mmt | Al alloy (5052) | 14.1 | 13.7 |
| 3-9 | Ta 4 mmt | Al alloy (5052) | 14.3 | 13.6 |

Copper-chromium alloy backing plate (bonded at 250° C.)

| Examples | High-melting point metal plate | Insert materials | Thickness of insert materials 1 mm | 4 mm |
|---|---|---|---|---|
| 3-10 | Ta 2 mmt | Al | 15.7 | 16.2 |
| 3-11 | Ta 4 mmt | Al | 15.3 | 15.7 |
| 3-12 | Ta 6 mmt | Al | 15.7 | 15.3 |
| 3-13 | Nb 2 mmt | Al | 14.3 | 15.2 |
| 3-14 | V 2 mmt | Al | 14.9 | 15.3 |
| 3-15 | Ti 2 mmt | Al | 16.4 | 16.1 |
| 3-16 | Mo 2 mmt | Al | 16.2 | 16.4 |
| 3-17 | Ta 2 mmt | Al alloy (5052) | 14.8 | 14.0 |
| 3-18 | Ta 4 mmt | Al alloy (5052) | 14.5 | 14.2 |

Copper-zinc backing plate (bonded at 250° C.)

| Examples | High-melting point metal plate | Insert materials | Thickness of insert materials 1 mm | 4 mm |
|---|---|---|---|---|
| 3-19 | Ta 2 mmt | Al | 14.5 | 14.9 |
| 3-20 | Ta 4 mmt | Al | 14.6 | 14.7 |
| 3-21 | Ta 6 mmt | Al | 14.3 | 14.2 |
| 3-22 | Nb 2 mmt | Al | 15.2 | 15.5 |
| 3-23 | V 2 mmt | Al | 15.2 | 15.6 |
| 3-24 | Ti 2 mmt | Al | 16.4 | 16.2 |

TABLE 4-continued

Tensile testing of high-melting point metal plate-Al,
Al alloy insert-backing plate (Unit: kgf/mm$^2$)

| 3-25 | Mo 2 mmt | Al | 16.3 | 16.4 |
| 3-26 | Ta 2 mmt | Al alloy (5052) | 15.3 | 15.1 |
| 3-27 | Ta 4 mmt | Al alloy (5052) | 13.5 | 14.6 |

TABLE 5

Amount of warpage of bonds
(Unit: mm)

Pure Cu backing plate (bonded at 250° C.)

| Examples | High-melting point metal plate | Insert materials | Thickness of insert materials 1 mm | 4 mm |
|---|---|---|---|---|
| 3-1 | Ta 2 mmt | Al | 0.2 | 0.2 |
| 3-2 | Ta 4 mmt | Al | 0.2 | 0.2 |
| 3-3 | Ta 6 mmt | Al | 0.2 | 0.2 |
| 3-4 | Nb 2 mmt | Al | 0.2 | 0.2 |
| 3-5 | V 2 mmt | Al | 0.2 | 0.2 |
| 3-6 | Ti 2 mmt | Al | 0.2 | 0.2 |
| 3-7 | Mo 2 mmt | Al | 0.2 | 0.2 |
| 3-8 | Ta 2 mmt | Al alloy (5052) | 0.2 | 0.2 |
| 3-9 | Ta 4 mmt | Al alloy (5052) | 0.2 | 0.2 |

Copper-chromium alloy backing plate (bonded at 250° C.)

| Examples | High-melting point metal plate | Insert materials | Thickness of insert materials 1 mm | 4 mm |
|---|---|---|---|---|
| 3-10 | Ta 2 mmt | Al | 0.2 | 0.2 |
| 3-11 | Ta 4 mmt | Al | 0.2 | 0.2 |
| 3-12 | Ta 6 mmt | Al | 0.2 | 0.2 |
| 3-13 | Nb 2 mmt | Al | 0.2 | 0.2 |
| 3-14 | V 2 mmt | Al | 0.2 | 0.2 |
| 3-15 | Ti 2 mmt | Al | 0.2 | 0.2 |
| 3-16 | Mo 2 mmt | Al | 0.2 | 0.2 |
| 3-17 | Ta 2 mmt | Al alloy (5052) | 0.2 | 0.2 |
| 3-18 | Ta 4 mmt | Al alloy (5052) | 0.2 | 0.2 |

Copper-zinc backing plate (bonded at 250° C.)

| Examples | High-melting point metal plate | Insert materials | Thickness of insert materials 1 mm | 4 mm |
|---|---|---|---|---|
| 3-19 | Ta 2 mmt | Al | 0.2 | 0.2 |
| 3-20 | Ta 4 mmt | Al | 0.2 | 0.2 |
| 3-21 | Ta 6 mmt | Al | 0.2 | 0.2 |
| 3-22 | Nb 2 mmt | Al | 0.2 | 0.2 |
| 3-23 | V 2 mmt | Al | 0.2 | 0.2 |
| 3-24 | Ti 2 mmt | Al | 0.2 | 0.2 |
| 3-25 | Mo 2 mmt | Al | 0.2 | 0.2 |
| 3-26 | Ta 2 mmt | Al alloy (5052) | 0.2 | 0.2 |
| 3-27 | Ta 4 mmt | Al alloy (5052) | 0.2 | 0.2 |

Example 4-1 to Example 4-27

In these Examples, as with Example 2 described above, high-melting point metal and niobium-osmium alloy powder were used (provided that tantalum silicide powder was used in Example 4-6, Example 4-15 and Example 4-24) to obtain target materials formed of a niobium-osmium alloy sintered compact and a tantalum silicide sintered compact of a trilaminar structure bonded with the upper and lower high-melting point metal plates. Subsequently, as with Example 2, the target material bonded with the foregoing melting point metal plates was mounted on a backing plate via aluminum and aluminum alloy insert materials of 1 mm and 4 mm. The difference with Example 2 and this case is that these were heated to 350° C. and bonded. Similarly, tensile testing of the bonding interface of the niobium-osmium alloy compound plate and the tantalum silicide compound plate was conducted.

The results are shown in Table 6. As shown in Table 6, the bond strength in all cases was 13.5 to 18.4 kgf/mm$^2$, and there was sufficient bond strength between the target material and the backing plate material. This bond strength generally improved in comparison to the bond strength of Example 2 and Example 3.

Meanwhile, the amount of warpage of the bond is shown in Table 7. As shown in Table 7, the amount of warpage was slightly higher in comparison to Example 2 and Example 3. Nevertheless, the amount of warpage in all cases was slight at 0.3 mm and at the most at 0.4 mm, and was not at a problematic level in producing the target.

Subsequently, the upper high-melting point metal plate was cut and eliminated to expose the niobium-osmium alloy face (tantalum silicide face in the case of Example 4-6, Example 4-15 and Example 4-24), the backing plate was machined into a prescribed shape, and the target was bonded to the backing plate via the high-melting point metal plate and an aluminum insert or aluminum alloy material so as to obtain a niobium-osmium alloy sintered compact sputtering target and a tantalum silicide sintered compact sputtering target.

The sputtering target material prepared as described above was DC sputtered onto a SiO$_2$ substrate under the same conditions as the foregoing conditions. Consequently, there was no generation of cracks in the target material and stable sputtering was possible up to the target life end.

TABLE 6

Tensile testing of high-melting point metal plate-Al,
Al alloy insert-backing plate (Unit: kgf/mm$^2$)

Pure copper backing plate (bonded at 350° C.)

| Examples | High-melting point metal plate | Insert materials | Thickness of insert materials 1 mm | 4 mm |
|---|---|---|---|---|
| 4-1 | Ta 2 mmt | Al | 16.1 | 16.4 |
| 4-2 | Ta 4 mmt | Al | 16.4 | 16.3 |
| 4-3 | Ta 6 mmt | Al | 16.6 | 16.5 |
| 4-4 | Nb 2 mmt | Al | 16.3 | 16.4 |
| 4-5 | V 2 mmt | Al | 16.3 | 16.2 |
| 4-6 | Ti 2 mmt | Al | 17.3 | 17.8 |
| 4-7 | Mo 2 mmt | Al | 17.4 | 17.7 |
| 4-8 | Ta 2 mmt | Al alloy (5052) | 15.1 | 16.0 |
| 4-9 | Ta 4 mmt | Al alloy (5052) | 14.7 | 15.8 |

Copper-chromium alloy backing plate (bonded at 350° C.)

| Examples | High-melting point metal plate | Insert materials | Thickness of insert materials 1 mm | 4 mm |
|---|---|---|---|---|
| 4-10 | Ta 2 mmt | Al | 16.6 | 16.9 |
| 4-11 | Ta 4 mmt | Al | 16.8 | 16.9 |
| 4-12 | Ta 6 mmt | Al | 16.6 | 16.5 |
| 4-13 | Nb 2 mmt | Al | 16.5 | 16.6 |
| 4-14 | V 2 mmt | Al | 16.6 | 16.7 |

TABLE 6-continued

Tensile testing of high-melting point metal plate-Al,
Al alloy insert-backing plate (Unit: kgf/mm²)

| 4-15 | Ti 2 mmt | Al | 17.7 | 18.0 |
| 4-16 | Mo 2 mmt | Al | 17.8 | 18.1 |
| 4-17 | Ta 2 mmt | Al alloy (5052) | 16.1 | 15.7 |
| 4-18 | Ta 4 mmt | Al alloy (5052) | 15.1 | 15.7 |

Copper-zinc backing plate (bonded at 350° C.)

| Examples | High-melting point metal plate | Insert materials | Thickness of insert materials 1 mm | 4 mm |
|---|---|---|---|---|
| 4-19 | Ta 2 mmt | Al | 15.2 | 15.4 |
| 4-20 | Ta 4 mmt | Al | 15.1 | 15.0 |
| 4-21 | Ta 6 mmt | Al | 15.7 | 15.6 |
| 4-22 | Nb 2 mmt | Al | 14.9 | 14.6 |
| 4-23 | V 2 mmt | Al | 14.5 | 14.4 |
| 4-24 | Ti 2 mmt | Al | 18.1 | 18.2 |
| 4-25 | Mo 2 mmt | Al | 18.4 | 18.3 |
| 4-26 | Ta 2 mmt | Al alloy (5052) | 15.6 | 13.5 |
| 4-27 | Ta 4 mmt | Al alloy (5052) | 13.5 | 14.5 |

TABLE 7

Amount of warpage of bonds
(Unit: mm)

Pure copper backing plate (bonded at 350° C.)

| Examples | High-melting point metal plate | Insert materials | Thickness of insert materials 1 mm | 4 mm |
|---|---|---|---|---|
| 4-1 | Ta 2 mmt | Al | 0.3 | 0.3 |
| 4-2 | Ta 4 mmt | Al | 0.3 | 0.3 |
| 4-3 | Ta 6 mmt | Al | 0.3 | 0.3 |
| 4-4 | Nb 2 mmt | Al | 0.3 | 0.3 |
| 4-5 | V 2 mmt | Al | 0.3 | 0.3 |
| 4-6 | Ti 2 mmt | Al | 0.4 | 0.4 |
| 4-7 | Mo 2 mmt | Al | 0.4 | 0.4 |
| 4-8 | Ta 2 mmt | Al alloy (5052) | 0.3 | 0.4 |
| 4-9 | Ta 4 mmt | Al alloy (5052) | 0.4 | 0.4 |

Copper-chromium alloy backing plate (bonded at 350° C.)

| Examples | High-melting point metal plate | Insert materials | Thickness of insert materials 1 mm | 4 mm |
|---|---|---|---|---|
| 4-10 | Ta 2 mmt | Al | 0.3 | 0.3 |
| 4-11 | Ta 4 mmt | Al | 0.3 | 0.3 |
| 4-12 | Ta 6 mmt | Al | 0.3 | 0.3 |
| 4-13 | Nb 2 mmt | Al | 0.3 | 0.3 |
| 4-14 | V 2 mmt | Al | 0.3 | 0.3 |
| 4-15 | Ti 2 mmt | Al | 0.3 | 0.3 |
| 4-16 | Mo 2 mmt | Al | 0.4 | 0.3 |
| 4-17 | Ta 2 mmt | Al alloy (5052) | 0.4 | 0.4 |
| 4-18 | Ta 4 mmt | Al alloy (5052) | 0.4 | 0.4 |

Copper-zinc backing plate (bonded at 350° C.)

| Examples | High-melting point metal plate | Insert materials | Thickness of insert materials 1 mm | 4 mm |
|---|---|---|---|---|
| 4-19 | Ta 2 mmt | Al | 0.3 | 0.3 |
| 4-20 | Ta 4 mmt | Al | 0.3 | 0.3 |
| 4-21 | Ta 6 mmt | Al | 0.3 | 0.3 |
| 4-22 | Nb 2 mmt | Al | 0.3 | 0.3 |
| 4-23 | V 2 mmt | Al | 0.3 | 0.3 |
| 4-24 | Ti 2 mmt | Al | 0.3 | 0.3 |

TABLE 7-continued

Amount of warpage of bonds
(Unit: mm)

| 4-25 | Mo 2 mmt | Al | 0.3 | 0.3 |
| 4-26 | Ta 2 mmt | Al alloy (5052) | 0.4 | 0.3 |
| 4-27 | Ta 4 mmt | Al alloy (5052) | 0.4 | 0.3 |

Example 5-1 to Example 5-27

In these Examples, the 4 mm tantalum plate that showed favorable characteristics in the previous Examples was used to obtain a high-melting point metal ceramic sintered compact of a trilaminar structure in which niobium-osmium alloy powder was bonded in between the upper and lower high-melting point metal plates shown in Table 8, and various tests were conducted upon changing the insert material and changing the bond temperature.

Tensile testing between the target material and the backing plate and the amount of warpage of the target was measured in cases where no insert material was used, cases of changing the aluminum insert material to 0.5 mmt, 2 mmt, 4 mmt, and 8 mmt, and cases of using 2 mmt Ag, Ni, Ti insert materials, and by further changing the bond temperature of the target material bonded with the high-melting point metal plate and the backing plate to be in a range of 130° C. to 600° C.

Subsequently, the upper high-melting point metal plate was cut and eliminated to expose the target face, the backing plate was machined into a prescribed shape, and the target material was bonded to the backing plate via the high-melting point metal plate and various insert materials to obtain a sintered compact sputtering target.

Among the above, as shown in Example 5-3, Example 5-12, and Example 5-21, when using 2 mmt aluminum as the insert material and performing bonding at a bond temperature of 150° C., the most favorable results were obtained in which the bond strength between the target bonded with the high-melting point metal plate and the backing plate was high, regardless of the type of backing plate, and with a small amount of warpage of the target. Nevertheless, in the other Examples, variations in the tensile strength between the target and the backing plate and the amount of warpage of the target were observed based on the type of insert material and changes in the bond temperature.

The sputtering target material prepared as described above was DC sputtered onto a $SiO_2$ substrate under the same conditions as the foregoing conditions. Consequently, there was no generation of cracks in the target material, the discharge stability was superior, and stable sputtering was possible up to the target life end.

TABLE 8

Tensile testing of high-melting point metal plate-Al, Al
alloy insert-backing plate (Unit: kgf/mm²)

| | Pure copper backing plate | | | |
|---|---|---|---|---|
| Examples | High-melting point metal plate | Insert materials | Bond Temperature (° C.) | Tensile Testing (kgf/mm²) | Warpage (mm) |
| 5-1 | Ta 2 mmt | None | 600 | 13.2 | 2.5 |
| 5-2 | Ta 4 mmt | Al 0.5 mm | 150 | 16.4 | 1.1 |
| 5-3 | Ta 4 mmt | Al 2 mm | 150 | 16.6 | 0.3 |
| 5-4 | Ta 4 mmt | Al 8 mm | 150 | 10.5 | 0.1 |
| 5-5 | Ta 4 mmt | Ag 2 mm | 500 | 9.8 | 2.1 |

TABLE 8-continued

Tensile testing of high-melting point metal plate-Al, Al alloy insert-backing plate (Unit: kgf/mm²)

| 5-6 | Ta 4 mmt | Ni 2 mm | 500 | 8.6 | 1.9 |
| 5-7 | Ta 4 mmt | Ti 2 mm | 500 | 9.4 | 2.7 |
| 5-8 | Ta 4 mmt | Al 4 mm | 130 | 7.8 | 0.1 |
| 5-9 | Ta 4 mmt | Al 4 mm | 400 | 14.5 | 1.9 |

Copper-chromium alloy backing plate

| Examples | High-melting point metal plate | Insert materials | Bond Temperature (° C.) | Tensile Testing (kgf/mm²) | Warpage (mm) |
|---|---|---|---|---|---|
| 5-10 | Ta 4 mmt | None | 600 | 15.4 | 2.1 |
| 5-11 | Ta 4 mmt | Al 0.5 mm | 150 | 16.4 | 0.9 |
| 5-12 | Ta 4 mmt | Al 2 mm | 150 | 16.6 | 0.2 |
| 5-13 | Ta 4 mmt | Al 8 mm | 150 | 9.8 | 0.1 |
| 5-14 | Ta 4 mmt | Ag 2 mm | 500 | 9.7 | 1.8 |
| 5-15 | Ta 4 mmt | Ni 2 mm | 500 | 8.5 | 1.7 |
| 5-16 | Ta 4 mmt | Ti 2 mm | 500 | 8.9 | 2.5 |
| 5-17 | Ta 4 mmt | Al 2 mm | 130 | 5.8 | 0.3 |
| 5-18 | Ta 4 mmt | Al 2 mm | 400 | 14.5 | 1.5 |

Copper-zinc alloy backing plate

| Examples | High-melting point metal plate | Insert materials | Bond Temperature (° C.) | Tensile Testing (kgf/mm²) | Warpage (mm) |
|---|---|---|---|---|---|
| 5-19 | Ta 4 mmt | None | 600 | 12.2 | 2 |
| 5-20 | Ta 4 mmt | Al 0.5 mm | 150 | 16.4 | 1.1 |
| 5-21 | Ta 4 mmt | Al 2 mm | 150 | 16.6 | 0.3 |
| 5-22 | Ta 4 mmt | Al 8 mm | 150 | 10.5 | 0.1 |
| 5-23 | Ta 4 mmt | Ag 2 mm | 500 | 9.8 | 2.1 |
| 5-24 | Ta 4 mmt | Ni 2 mm | 500 | 8.6 | 1.9 |
| 5-25 | Ta 4 mmt | Ti 2 mm | 500 | 9.4 | 2.7 |
| 5-26 | Ta 4 mmt | Al 2 mm | 130 | 4.3 | 0.3 |
| 5-27 | Ta 4 mmt | Al 2 mm | 400 | 13.6 | 1.3 |

Comparative Example 1-1 to Comparative Example 1-4 and Comparative Example 1-8 to Comparative Example 1-9

In a case of not using a high-melting point metal plate as shown in Table 9, niobium-osmium alloy powder was filled in a graphite die, and this was sintered via hot pressing in a vacuum at a pressure of 100 kg/cm² and temperature of 1850 C for 10 hours in order to obtain a niobium-osmium alloy sintered compact (target material).

Subsequently, diffusion bonding of the target material and the backing plate was performed at the temperatures shown in Table 9 regarding cases where no insert material was used, cases where a Cu insert material was used, cases where a Ti insert material was used, and cases where an Al insert material was used, respectively. The types of backing plates that were used are as shown in Table 9.

The bond strength, post-bond warpage, sputter characteristics and bonding were visually observed, and the results are similarly shown in Table 9.

As shown in Table 9, since Comparative Example 1-1 did not use a high-melting point metal plate or an insert material, the bond strength between the target and the backing plate was weak at 0.5 kg/mm², and peeling occurred at the diffusion bonding interface at the time of machining.

With Comparative Example 1-2, although the bond temperature was set high at 800° C., since it did not use a high-melting point metal plate or an insert material, cracks were generated after the diffusion bonding of the target and the backing plate.

Comparative Example 1-3 is a case where the bond temperature was set high at 700° C., did not use a high-melting point metal plate, but used Cu as the insert material. The bond strength between the target and the backing plate was high, but the warpage of the target after the bonding was large at 5 mm, and cracks were also generated after the diffusion bonding.

Comparative Example 1-4 is a case where a high-melting point metal plate was not used, and Ti was used as the insert material. The bond strength between the target and the backing plate was low, and peeling occurred at the diffusion bonding interface at the time of machining.

Comparative Example 1-8 is a case where a high-melting point metal plate was not used, and Al was used as the insert material. The sputtering characteristics were inferior, and peeling occurred at the diffusion bonding interface of the target and the backing plate during sputtering.

Comparative Example 1-9 is a case where a high-melting point metal plate was not used, the bond temperature was raised to 500° C., and Al was used as the insert material. Although the bond strength increased, cracks were generated in the target after the diffusion bonding.

Comparative Example 1-5 to Comparative Example 1-7 and Comparative Example 1-10

In these Comparative Examples, as shown in Table 9, a Ta plate and a Mo plate were used as the high-melting point metal plate, niobium-osmium alloy powder was filled in a graphite lie, and this was sintered via hot pressing in a vacuum at a pressure of 100 kg/cm² and temperature of 1850° C. for 10 hours in order to obtain a niobium-osmium alloy sintered compact.

Subsequently, diffusion bonding of the target material and the backing plate was performed at the temperatures shown in Table 9 regarding cases where no insert material was used, cases where a Cu insert material was used, and cases where an Al alloy insert material was used, respectively.

The bond strength, post-bond warpage, sputter characteristics and bonding were visually observed, and the results are similarly shown in Table 9.

With Comparative Example 1-5, although a 0.5 mmt Ta was used as the plate high-melting point metal plate, it could not be said that the thickness was sufficient. In addition, since an insert material was not used, the bond strength between the target and the backing plate was weak at 0.3 kg/mm², and peeling occurred at the diffusion bonding interface at the time of machining.

Comparative Example 1-6 is a case where a 0.2 mmt Ta plate was used as the high-melting point metal plate, the bond temperature was set high at 500° C., and an insert material was not used. Although the bond strength of the target bonded with the high-melting point metal plate and the backing plate increased, cracks were generated after the diffusion bonding.

Comparative Example 1-7 is a case where a 0.5 mmt Ta plate was used as the high-melting point metal plate, and Cu was used as the insert material. The bond strength was low, the sputter characteristics were inferior, and peeling occurred at the diffusion bonding interface of the target bonded with the high-melting point metal plate and the backing plate during sputtering.

Comparative Example 1-10 is a case where a 0.5 mmt Mo plate was used as the high-melting point metal plate, and Al alloy was used as the insert material. Since the bond temperature was low at 50° C., it was essentially impossible to bond the target and the backing plate.

TABLE 9

| | | Comparative Examples | | | | | |
|---|---|---|---|---|---|---|---|
| Comparative Examples | High-melting point metal Plate | Target material | Insert material | Material of Backing Plate | Diffusion Bonding Temp (° C.) | Bond Strength (kg/mm$^2$) | Warpage After Bond (mm) |
| 1-1 | none | Nb—Os | none | CuCr | 200 | 0.5 | 0.5 |
| 1-2 | none | Nb—Os | none | CuZn | 800 | 5 | 3 |
| 1-3 | none | Nb—Os | Cu | CuZn | 700 | 20 | 5 |
| 1-4 | none | Nb—Os | Ti | CuZn | 200 | 1 | 0.7 |
| 1-5 | Ta 0.5 mmt | Nb—Os | none | CuCr | 250 | 0.3 | 0.2 |
| 1-6 | Ta 0.2 mmt | Nb—Os | none | CuZn | 500 | 15 | 2 |
| 1-7 | Ta 0.5 mmt | Nb—Os | Cu | CuZn | 200 | 3 | 1 |
| 1-8 | none | Nb—Os | Al | Cu | 300 | 2 | 0.5 |
| 1-9 | none | Nb—Os | Al | Cu | 500 | 5 | 3 |
| 1-10 | Mo 0.5 mmt | Nb—Os | Al alloy | CuCr | 50 | — | — |

| Comparative Examples | Sputtering Characteristics | Comment |
|---|---|---|
| 1-1 | — | Peeling at diffusion bonding interface in machining |
| 1-2 | — | Cracks after diffusion bonding |
| 1-3 | — | Cracks after diffusion bonding |
| 1-4 | — | Peeling at diffusion bonding interface in machining |
| 1-5 | — | Peeling at diffusion bonding interface in machining |
| 1-6 | — | Cracks after diffusion bonding |
| 1-7 | Inferior | Peeling at diffusion bonding interface in machining |
| 1-8 | Inferior | Peeling at diffusion bonding interface in machining |
| 1-9 | — | Cracks after diffusion bonding |
| 1-10 | — | Unable to bond |

As evident from the foregoing Comparative Examples, with cases that do not use a high-melting point metal plate, a problem arises where cracks are generated after the diffusion bonding of the target and the backing plate, or peeling occurs at the diffusion bonding interface of the target and the backing plate at the time of machining or during sputtering. Similar results were also observed when the high-melting point metal plate does not possess sufficient thickness.

If the diffusion bonding temperature is increased in an attempt to remedy the deterioration in the bond strength at the diffusion bonding interface of the target and the backing plate, a problem arises in that the warpage of the target after the bonding will increase. In either case, with the conditions of the Comparative Examples, the bond strength is insufficient and there is a drawback in that the warpage of the target will increase.

Moreover, although the existence of an insert material yields an effect of increasing the bond strength, it is evident that there are limitations with the conditions of the Comparative Examples.

Example 6-1 to Example 6-28

In these Examples, as shown in Table 10, the target material was selected from TaC, ZrB$_2$, WSi$_2$, and TaN, the high-melting point metal plate was selected from Ta, Nb, V, Ti, and Mo, the thickness was changed within the range of 2 to 6 mm, Al and Al alloy were used as the insert material, and a high-melting point metal ceramic sintered compact of a trilaminar structure bonded with upper and lower high-melting point metal plates was obtained. This was bonded to a backing plate. CuZn, Cu, CuZn, and CuCr were used as the backing plate. The bond temperature of the target material and the backing plate was set to 250° C.

Subsequently, the upper high-melting point metal plate was cut and eliminated to expose the target face, the backing plate was machined into a prescribed shape, and the target material was bonded to the backing plate via the high-melting point metal plate and various insert materials to obtain a sintered compact sputtering target.

The sputtering target material prepared as described above was DC sputtered onto a SiO$_2$ substrate under the same conditions as the foregoing conditions. Consequently, there was no generation of cracks in the target material, the discharge stability was superior, and stable sputtering was possible up to the target life end.

The results are similarly shown in Table 10. As described above, it has been discovered that similar favorable results could be obtained even with various combinations of the target material, high-melting point metal plate, and insert material within the scope of the present invention.

TABLE 10

Evaluation of sputtering characteristics of each target

| | Target materials | | | | Sputtering characteristics | |
|---|---|---|---|---|---|---|
| Examples | Target materials | High-melting point metal plates | Insert materials | Backing plate materials | Cracks on target materials | Discharge stability |
| 6-1 | TaC | Ta 2 mm | Al 2 mm | CuZn | none | good |
| 6-2 | ZrB$_2$ | Ta 4 mm | Al 3 mm | CuZn | none | good |
| 6-3 | WSi$_2$ | Ta 6 mm | Al 1 mm | CuZn | none | good |
| 6-4 | TaN | Ta 3 mm | Al 4 mm | CuZn | none | good |
| 6-5 | TaC | Ta 2 mm | Al 2 mm | CuCr | none | good |
| 6-6 | ZrB$_2$ | Ta 4 mm | Al 2 mm | CuCr | none | good |
| 6-7 | WSi$_2$ | Ta 2 mm | Al 2 mm | Cu | none | good |
| 6-8 | TaN | Ta 4 mm | Al 2 mm | Cu | none | good |
| 6-9 | TaC | Nb 2 mm | Al 2 mm | CuZn | none | good |
| 6-10 | ZrB$_2$ | Nb 4 mm | Al 3 mm | CuZn | none | good |
| 6-11 | WSi$_2$ | Nb 6 mm | Al 1 mm | CuZn | none | good |
| 6-12 | TaN | Nb 3 mm | Al 4 mm | CuZn | none | good |
| 6-13 | TaC | V 2 mm | Al 2 mm | CuCr | none | good |
| 6-14 | ZrB$_2$ | V 4 mm | Al 2 mm | CuCr | none | good |
| 6-15 | WSi$_2$ | V 3 mm | Al 4 mm | CuZn | none | good |
| 6-16 | TaN | V 2 mm | Al 2 mm | CuCr | none | good |
| 6-17 | WSi$_2$ | Ti 2 mm | Al 2 mm | CuCr | none | good |
| 6-18 | WSi$_2$ | Ti 4 mm | Al 4 mm | CuCr | none | good |
| 6-19 | WSi$_2$ | Ti 6 mm | Al 2 mm | CuZn | none | good |
| 6-20 | WSi$_2$ | Ti 3 mm | Al 2 mm | CuCr | none | good |
| 6-21 | TaC | Mo 2 mm | Al 2 mm | CuZn | none | good |
| 6-22 | ZrB$_2$ | Mo 2 mm | Al 2 mm | CuZn | none | good |
| 6-23 | WSi$_2$ | Mo 4 mm | Al 2 mm | CuZn | none | good |
| 6-24 | TaN | Mo 6 mm | Al 4 mm | CuZn | none | good |
| 6-25 | TaC | Ta 2 mm | Al-5052 2 mm | CuZn | none | good |
| 6-26 | ZrB$_2$ | Ta 2 mm | Al-5052 2 mm | CuZn | none | good |
| 6-27 | WSi$_2$ | Ta 4 mm | Al-5052 3 mm | CuZn | none | good |
| 6-28 | TaN | Ta 6 mm | Al-5052 4 mm | CuZn | none | good |

High power sputtering is enabled since it is possible to effectively inhibit the generation of cracks during the target production and sputtering, and it is also possible to inhibit the reaction of the target raw material with the die, reduce the warpage of the target during the target production, and perform ion sputtering in which the sputtered particles are ionized. Accordingly, the present invention is useful in producing a target formed of a sintering-resistant material of high-melting point metal alloy, high-melting point metal silicide, high-melting point metal carbide, high-melting point metal nitride or high-melting point metal boride, which has poor machinability.

The invention claimed is:

1. A production method of a composite sputtering target comprising a sputtering target and a backing plate, the sputtering target formed of a sintered body formed of a powder of a sinter-resistant material of an alloy of high-melting point metals or a silicide, carbide, nitride or boride of one high-melting point metal, and the production method comprising the steps of:
    placing a first plate in a graphite die, the first plate having a thickness of 2 to 6 mm and being made of a high-melting point metal different from the sinter-resistant material of the sputtering target;
    placing powder of the sinter-resistant material in the graphite die on the first plate, thereby forming a layer of powder on the first plate within the graphite die;
    placing a second plate on the layer of the powder of the sinter-resistant material in the graphite die, the second plate having a thickness of 2 to 6 mm and being made of a high-melting point metal different from the sinter-resistant material of the sputtering target to obtain a threefold layered structure consisting of the first plate, the layer of powder, and the second plate;
    subjecting the threefold layered structure to heating and pressing to sinter the powder and to diffusion-bond the sintered powder to the first and second plates, the threefold layered structure thereby being converted to a sintered composite body;
    removing the sintered composite body from the graphite die and bonding the first plate of the sintered composite body to a surface of the backing plate via an insert material made of aluminum or an alloy containing aluminum as a main component thereof, the backing plate being funned of copper or a copper alloy; and
    machining the sintered composite body bonded to the backing plate to eliminate the second plate of the sintered composite body to form the composite sputtering target;
    wherein the high melting point metals for making the sinter-resistant material for the sputtering target or for making the first and second plates are characterized in having a melting point of about 1700° C. or higher.

2. The production method according to claim 1, wherein the first plate is made of tantalum, niobium, vanadium, titanium or molybdenum, or an alloy comprising one of tantalum, niobium, vanadium, titanium and molybdenum as a main component of the alloy.

3. The production method according to claim 2, wherein the first plate is subject to diffusion bonding at a temperature of 1000 to 2000° C.

4. A production method of a composite sputtering target comprising a sputtering target and a backing plate, the sputtering target formed of a sintered body formed of a powder of a sinter-resistant material of an alloy of high-melting point metals or a silicide, carbide, nitride or boride of one high-melting point metal, and the production method comprising the steps of:

placing a first plate in a graphite die, the first plate having a thickness of 2 to 6 mm and being made of a high-melting point metal different from the sinter-resistant material of the sputtering target;

placing powder of the sinter-resistant material in the graphite die on the first plate, thereby forming a layer of powder on the first plate within the graphite die;

placing a second plate on the layer of the powder of the sinter-resistant material in the graphite die, the second plate having a thickness of 2 to 6 mm and being made of a high-melting point metal different from the sinter-resistant material of the sputtering target to obtain a threefold layered structure consisting of the first plate, the layer of powder, and the second plate;

subjecting the threefold layered structure to heating and pressing to sinter the powder and to diffusion-bond the sintered powder to the first and second plates, the threefold layered structure thereby being converted to a sintered composite body;

removing the sintered composite body from the graphite die and bonding the first plate of the sintered composite body to a surface of the backing plate via an insert material made of aluminum or an alloy containing aluminum as a main component thereof at a temperature of 150 to 350° C., the backing plate being formed of copper or a copper alloy; and machining the sintered composite body bonded to the backing plate to eliminate the second plate of the sintered composite body to form the composite sputtering target;

wherein the high melting point metals for making the sinter-resistant material for the sputtering target or for making the first and second plates are characterized in having a melting point of about 1700° C. or higher.

5. The production method according to claim 4, wherein the insert material has a thickness of 1 to 4 mm.

6. The production method according to claim 1, wherein the insert material has a thickness of 1 to 4 mm.

7. The production method according to claim 1, wherein the first plate is subject to diffusion bonding at a temperature of 1000 to 2000° C.

\* \* \* \* \*